United States Patent [19]
Massingill

[11] Patent Number: 5,420,460
[45] Date of Patent: May 30, 1995

[54] THIN CAVITY DOWN BALL GRID ARRAY PACKAGE BASED ON WIREBOND TECHNOLOGY

[75] Inventor: Thomas J. Massingill, Scotts Valley, Calif.

[73] Assignee: VLSI Technology, Inc., San Jose, Calif.

[21] Appl. No.: 102,638

[22] Filed: Aug. 5, 1993

[51] Int. Cl.$^6$ .................. H01L 23/48; H01L 23/34
[52] U.S. Cl. .................. 257/693; 257/697; 257/778
[58] Field of Search ............ 257/668, 690, 697, 737, 257/738, 778, 779, 666, 693

[56] References Cited

U.S. PATENT DOCUMENTS

| | | | |
|---|---|---|---|
| 3,868,166 | 2/1975 | Ammon | 339/176 MP |
| 4,338,621 | 7/1982 | Braun | 257/697 |
| 4,823,234 | 4/1989 | Konishi et al. | 257/697 |
| 4,940,181 | 7/1990 | Juskey, Jr. et al. | 228/180.2 |
| 4,979,903 | 12/1990 | Gosselin | 439/78 |
| 5,027,191 | 6/1991 | Bourdelaise et al. | 361/386 |
| 5,191,511 | 3/1993 | Sawaya | 361/383 |

FOREIGN PATENT DOCUMENTS

| | | | |
|---|---|---|---|
| 0336359 | 10/1989 | European Pat. Off. | 257/700 |
| 0312866 | 12/1989 | Japan | 257/666 |

*Primary Examiner*—Rolf Hille
*Assistant Examiner*—Peter Toby Brown
*Attorney, Agent, or Firm*—Majestic, Parson, Siebert & Hsue

[57] ABSTRACT

A high performance ball grid array is disclosed in which a ball grid array is modified to include a body having a recessed central cavity. The inclusion of a central cavity allows the die to be mounted on the same side of the package in which the solder balls are located. Since the die is mounted on the same side as that of the solder balls, only one set of leads is needed to electrically connect the die to the solder balls, thus requiring only one layer of electrically conductive material within the package, as opposed to conventional ball grid array packages which required two metal layers. In addition, since only one metal layer is needed, the present invention is able to operate without the use of electrically conductive vias. The die is connected via wire bonds to bonding areas located on the package. Each of the of bonding areas is substantially co-planar, and each bonding area is located at a different distance from one edge of the central cavity, thereby forming a staggered arrangement. The advantage of positioning the bonding areas in a staggered arrangement is that it enables the spacing between each of the adjacent bonding wires to be maintained, thereby avoiding fan-out of the bonding wires and avoiding the need for multi-level bonding areas in the package.

24 Claims, 3 Drawing Sheets

THIN CAVITY DOWN BALL GRID ARRAY PACKAGE BASED ON WIREBOND TECHNOLOGY

BACKGROUND OF THE INVENTION

The present invention relates generally to ball grid array packages, and more particularly to a thin cavity down ball grid array package based on wirebond technology.

In an integrated circuit, a number of active semiconductor devices are formed on a chip of silicon and interconnected in place by leads to form a complete circuit. As integrated circuit technology has advanced over the years, yields have increased to the point that large arrays of electronic circuits can be produced on a single semiconductor slice. Second and third level interconnections can be used to interconnect the individual circuits as desired and provide bonding pads at the edge of the slice. However, these circuit arrays usually require a large number of external connections. Typical terminal counts in excess of 300 are now required for gate arrays, microprocessors, and very high speed integrated circuit (VHSIC) devices.

In the past, integrated circuit chips have been packaged in a variety of ways. The most common packages are the flatpack, the dual-in-line, the hermetic and plastic chip carrier and the grid array packages, all of which are known to those skilled in the art.

One conventional technique used in the assembling of integrated circuit chip packages is the inclusion of a lead frame which electrically connects the semiconductor die to the outer pins of the package. However, as integrated circuits have become smaller and more complex, the number of leads coming out of the package has increased, even though the package size has remained the same or has decreased. Because of limits within the processing technology of the lead frame, conventional lead frames are no longer able to be used in packages which demand a relatively high pin count which, for example, is 300 or more. New assembling techniques for IC packages have since been developed which are able to accommodate the high pin count demanded by many of the newly manufactured semiconductor devices.

One such technique for assembling integrated circuit chip packages is the so-called TAB for tape automated bonding schemes. The TAB technique is known to those skilled in the art and makes it possible to obtain fine multiple lead patterns with a variety of pattern design variations. Using the TAB technique it is possible to accommodate a significantly larger number of leads than that of the conventional lead frame.

The use of the TAB technique is common in many of today's high lead count IC packages. One such high lead count package is the ball grid array. The ball grid array package is typically a square package with terminals, normally in the form of solder balls, protruding from the bottom of the package only. These terminals are designed to be mounted onto a plurality of bonding pads located on the surface of a printed wiring board (PWB) or other suitable substrate. Two conventional types of ball grid arrays are the TAB ball grid array (TBGA), and the plastic ball grid array (PBGA).

FIG. 1 is a cross-sectional view of a conventional TAB ball grid array. The die 102 is placed with its active surface facing the TAB tape 110. Laminated on each side of the TAB tape are electrically conductive leads 108 and 112. The die 102 is electrically connected to the inner leads 118 of the TAB tape, the inner leads 118 being part of the upper leads 108. Electrically conducting vias (not shown) connect the upper leads 108 to the lower leads 112 which are, in turn, connected to respective (or corresponding) solder balls 114. This results in each of the terminals of the die 102 being electrically connected to a respective solder ball 114. The active surface of the die 102 is then encapsulated with an encapsulating material 116, which provides environmental and scratch protection to the active surface of the die. In addition, stiffener 104 is bonded via a stiffener adhesive 106 to the TAB tape to give the package structural support. The stiffener 104 is typically made of electrically non-conductive material.

A second type of ball grid array is known as a plastic ball grid array (PBGA). The PBGA is known to those skilled in the art, and although the PBGA is able to accommodate the same relatively high lead count as that of the TBGA, the conventional PBGA is thicker than the conventional TBGA and also offers no means for dissipating heat from the die since the die is fully encapsulated. Despite this disadvantage, both the TAB ball grid array and plastic ball grid array are advantageous over other conventional packages in that both are able to accommodate the greatest number of leads of any of the conventional packages. However, these ball grid array packages are not without their drawbacks.

In general, one drawback associated with conventional ball grid array packages is that the substrate (either TAB tape or PCB material) is required to have two metal layers laminated to it (the metal layers being the conductive patterns 108 and 112 in Fig. 1). This is due to height restrictions created by the solder balls which prevent anything having a thickness greater than that of the solder balls from being mounted on the same side of the package in which the solder balls are located. Since the die is typically as thick as or thicker than the solder balls, attaching the die to the solder ball side of the package would prevent the solder balls from making contact with the printed wiring board (or PC board). In addition, the attachment of the thicker die to the solder ball side of the package will typically result in a thicker package, which is undesirable to many ball grid array package users. These height restrictions therefore require that the die be located on, and thus electrically connected to, one side of the package while the solder balls are located on, and electrically connected to, the opposite side of the package, thereby requiring the use of one metal layer on each side of the package. The necessary inclusion of two metal layers increases the cost of the manufacturing process of the package. In addition, conventional ball grid arrays require electrically conductive vias to connect one side of the metal leads to the other side, further increasing the cost of the manufacturing process.

Another such drawback of conventional ball grid array packages is the cost of the package itself. Referring particularly to conventional TBGA packages, it cost about $100.00 per wafer to form bonding bumps necessary to attach each die formed from the wafer to a respective TAB tape. Since approximately 10 to 20 dies can be produced from one wafer, this results in an increased cost of about $5.00–$10.00 per die using TAB technology. In addition, the length of time required to produce a conventional TBGA prototype is extremely lengthy. A TAB prototype typically takes approximately 16 weeks to complete from the time of design to the time when the part is actually manufactured.

In light of these drawbacks, therefore, one objective of the present invention is to provide a ball grid array package which is as thin as the conventional TAB ball grid array and is able to conduct heat away from the die while at the same time costs less to manufacture than the conventional TBGA and requires less time to produce a prototype. An additional objective of the present invention is to improve the electrical and thermal performance of the ball grid array package.

SUMMARY OF THE INVENTION

These and additional objectives are accomplished by the various aspects of the present invention, wherein, briefly, according to a principle aspect, a ball grid array package is modified to include a body having a recessed central cavity. The central cavity is located on the same face of the package in which the plurality of solder ball bonding pads (and solder balls) are located. The central cavity has cavity walls and a cavity ceiling upon which a semiconductor die is mounted. Bonded to the same side of body as that of the central cavity is a layer of electrically non-conductive substrate. Laminated to the substrate layer is a planar pattern of electrically conductive material which forms a plurality of bonding areas and a plurality of leads which electrically connect each of the bonding areas to a corresponding solder ball bonding pads (and therefore to a corresponding solder ball) without the use of electrically conductive vias. A plurality of conductive wires (wire bonds) electrically connect the semiconductor die directly to the plurality of bonding areas. For reference purposes, the present invention is termed a "High Performance Ball Grid Array (HBGA)".

This principle aspect of the present invention has several advantages over conventional ball grid array packages. First, the inclusion of a central cavity allows the die to be mounted on the same side of the package in which the solder balls are located. As discussed previously, the height restriction of the solder balls in conventional ball grid array packages prevents the mounting of the die on the same side of the package in which the solder balls are located. Thus, in conventional ball grid arrays (as shown in FIG. 1) the die is mounted on the opposite side of the package and connected through electrically conductive vias to the solder balls on the other side.

Second, since the die is mounted on the same side as that of the solder balls, only one set of leads is needed to electrically connect the die to the solder balls. Therefore, the layer of electrically non-conductive substrate need only contain one layer of electrically conductive material, as opposed to conventional ball grid array packages which required two metal layers. In addition, since only one metal layer is needed, the present invention is able to operate without the use of electrically conductive vias. Moreover, since the present invention does not require a second metal layer or electrically conductive vias, the manufacturing cost of the present invention is lower than that of conventional ball grid arrays, and the present invention is also thinner than most conventional ball grid arrays.

Third, because the semiconductor die is wire-bonded to the substrate, the cost of processing one wafer of semiconductor dies (including the wire bonding) is about $0.80 per die, which is much cheaper than the $5.00–$10.00 per die processing cost using TAB technology.

Lastly, the length of time to produce a prototype of the present invention is much shorter than that of conventional TBGAs. This is due to the flexibility of the wire bonding technique, and it is estimated that a prototype of the present invention can be manufactured in approximately 13–14 weeks, which is 2–3 weeks shorter than the typical 16 weeks needed to produce a TBGA prototype.

A second aspect of the present invention is directed to the positioning of a plurality of bonding areas within one bonding region of a plurality of bonding regions located on the substrate surface. The plurality of bonding areas function to electrically interconnect the wirebonds to respective solder ball bonding pads located on the surface of the package. The plurality of bonding areas are substantially co-planar, wherein the bonding areas in each region are located at different distances from one edge of the central cavity, thereby forming a staggered arrangement. The advantage of positioning the bonding areas in a staggered arrangement is that it enables the spacing between each of the adjacent bonding wires to be maintained, thereby avoiding fan-out of the bonding wires and avoiding the need for a multi-level substrate bonding area. By positioning the bonding areas in a co-planar, staggered arrangement, the thickness of the package is minimized. By avoiding fan-out of the bonding wires, valuable surface area on the package can be used for solder ball placement which, in turn, contributes to the ability of the package to accommodate a relatively high number of leads.

Additional objects, features and advantages of the various aspects of the present invention will become apparent from the following description of its Preferred Embodiments, which description should be taken in conjunction with the accompanying drawings.

DETAILED DESCRIPTION OF THE PREFERRED EMBODIMENT

Figure 1:
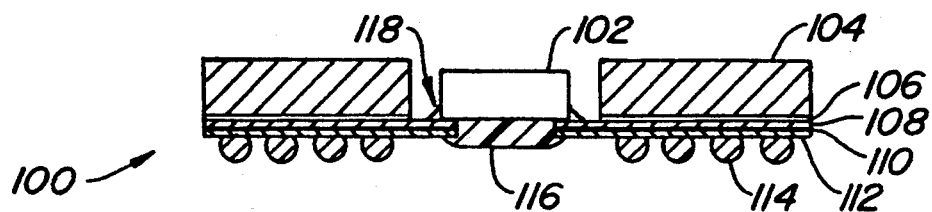
FIG. 1 is a cross-sectional view of a conventional TAB ball grid array (TBGA).
Figure 2A:
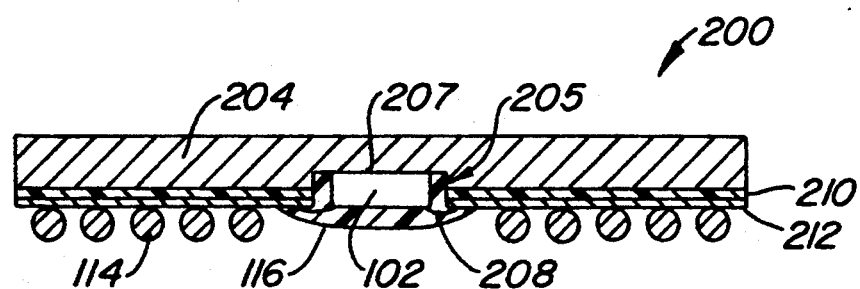
FIG. 2A is a cross-sectional view of a first embodiment of the present invention.
Figure 2B:
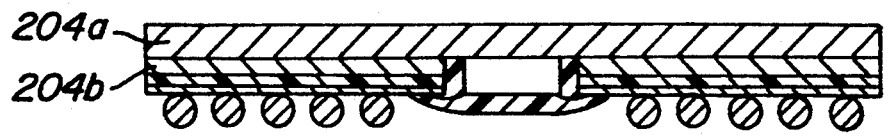
FIG. 2B is a cross-sectional view of a second embodiment of the present invention.
Figure 2C:
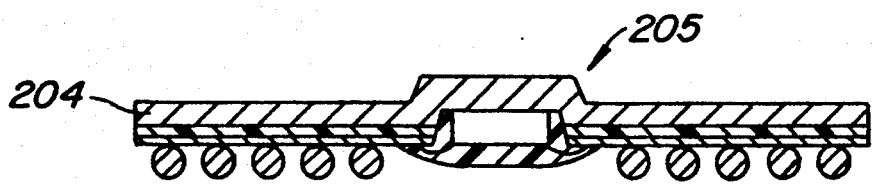
FIG. 2C is a cross-sectional view of a third embodiment of the present invention.

FIGS. 2A, 2B and 2C illustrate alternate embodiments of the present invention with the various elements therein disclosed. For convenience purposes, reference numbers for those elements which are common to each of the figures in the drawings will remain the same.

FIG. 2A shows a ball grid array integrated circuit chip package in accordance with the present invention. The package comprises a body 204 having a recessed central cavity which has cavity walls 205 and a cavity ceiling 207 upon which a semiconductor die 102 is mounted. The die 102 is bonded to the body 204 via either an adhesive such as epoxy or a thermal adhesive such as thermal grease. The body 204 can be flexible or non-flexible, and is preferably made of a material which can perform the following three functions: (1) a support function for providing structural support to the package, (2) a heat dissipating or spreading function for dissipating or spreading heat generated from the semiconductor die, and (3) a shielding function for shielding the die from electrical noise, thereby improving the electrical performance, of the package. An example of such a body material is copper. Note that although a material having the properties described above would be preferred, other materials not having all of the aforementioned properties may be used for the body 204 without departing from the scope of the invention, so long as the material used provides structural support to the package.

Each of the bodies in FIGS. 2A, 2B and 2C are manufactured using a different process, but accomplish the same purpose. The body 204 of FIG. 2A is manufactured using a cast to form the metal copper layer with the recessed cavity. Alternately, the body 204 of FIG. 2A can be manufactured using a coined heat spreader. The body of FIG. 2B is constructed using rolled sheets of copper. This is the reason for the two layers 204a and 204b. The two layers 204a and 204b are bonded together using an adhesive such as, for example, epoxy. The body of FIG. 2C is manufactured using a stamping technology, which is the reason for the raised portion of copper material 205. The embodiment of FIG. 2C, which uses the stamping technology, is the cheapest of the three embodiments to manufacture.

In addition to the body 204 and the die 102, the package of FIG. 2A is also shown to include a layer of electrically non-conductive substrate 210. This layer of substrate material, shown in each of the embodiments, is comprised of either TAB tape or thin printed wiring board (PWB) material such as, for example, FR4. The TAB tape itself may be comprised of Kapton TM film, a polyimide film, or other high temperature, high strength, flexible dielectric material.

Laminated to the surface of the substrate 210 is a planar pattern of electrically conductive material 212. As illustrated in greater detail in FIG. 6, the pattern of electrically conductive material 212 forms a plurality of electrically conductive leads 506 and regions 504 of a plurality of bonding areas 504a–c connected to the leads. Each of the bonding regions 504 includes a plurality of bonding areas 504a–c. Each of the leads 506 electrically connects each of the individual, co-planar bonding areas 504a–c to a corresponding solder ball bonding pad 510 of a plurality of solder ball bonding pads distributed on one side of the package. A plurality of conductive wires 208, otherwise referred to as bonding wires, electrically connect each of the bonding areas 504a–c on the substrate to a corresponding bond pad 502 on the semiconductor die 102.

Referring back to FIG. 2A, each bonding pad 510 (FIG. 6) has electrically connected to it a corresponding electrically conductive ball 114, which provides means for electrically connecting the package to a printed wiring board (PWB) or other suitable substrate. The electrically conductive ball may be comprised of, for example, solder or gold. For reference purposes, the electrically conductive ball will herein be referred to as a "solder ball." As will be explained in greater detail below, each solder ball acts as an individual "pin" to electrically connect a particular terminal or bond pad of the silicon die to a corresponding bonding pad on the PWB. After the die has been attached to the body and electrically connected to the solder balls, the die is then encapsulated with an encapsulating material 116 using an encapsulation or molding technique. The encapsulation of the semiconductor die and the bonding wires is commonly known to those skilled in the art and therefore will not be discussed further in this application.

It is to be noted that the embodiment of the present invention as depicted in FIGS. 2A, 2B, and 2C shows the die 102 being electrically connected to the layer of metal 212 which is located on the same side of the substrate layer in which the solder balls are located. This novel arrangement provides numerous advantages over conventional ball grid arrays, as discussed previously. Briefly, some of these advantages are: (1) that the layer of electrically non-conductive substrate need only contain one layer of electrically conductive material, as opposed to conventional ball grid array packages which required two metal layers; and (2) that the present invention is able to operate without the use of electrically conductive vias, and, in fact, is shown to be devoid of electrically conductive vias in each of the embodiments of FIGS. 2A, 2B, and 2C.

Figure 3:
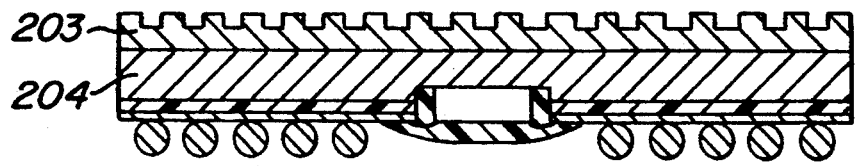
FIG. 3 is a cross-sectional view of the present invention thermally coupled to a heat sink.

FIG. 3 is an alternate embodiment of the present invention as illustrated in FIG. 2A further comprising a heat sink 203 thermally coupled to the package body 204. Note that the copper body 204 is a thermal conductor and is able to conduct heat away from the die 102. In an alternate embodiment of FIG. 2A, heat fins may be integrated directly into the body 204.

The heat sink 203 of FIG. 3 adds additional thermal protection to the package by conducting heat away from the copper body 204 and dissipating it more efficiently. The heat sink 203 can be thermally coupled to the copper body 204 via a thermal coupling material such as, for example, thermal grease. Although not shown, it is envisioned that the heat sink 203 can be thermally coupled to each of the other embodiments depicted in FIG. 2B and 2C.

Figure 4:
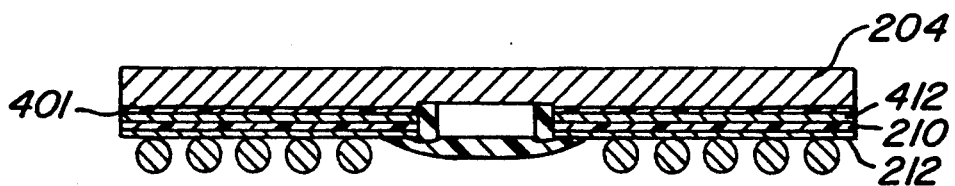
FIG. 4 is a cross-sectional view of a particular embodiment of the present invention comprising an additional layer of electrically conductive material 412 for improving the electrical performance of the package.

FIG. 4 illustrates an alternate embodiment of the present invention wherein the substrate layer 210 comprises two conductive layers of material. The first metal layer 212 comprises the pattern of electrically conductive material forming a plurality of electrically conductive leads and a plurality of bonding regions as discussed previously. The second metal layer 412 is interposed between the package body 204 and the substrate layer 210. In one particular embodiment the metal layer 412 is a single sheet of metal laminated to the substrate 210 and etched only near the central cavity to prevent any short circuiting when the substrate layer is punched out to form the cavity. It is envisioned that the metal layer 412 can be electrically connected to a power source (forming a power plane) or a referenced potential (forming a reference or ground plane). The advantage of this particular embodiment is that the second metal layer 412 provides additional electrical shielding to the semiconductor die, thereby improving the electrical performance of the package. In order to prevent short circuiting, an electrically insulative adhesive layer 401 is applied between the metal layer 412 and the copper body 204.

Alternately, the metal layer 412 can be etched into a pattern of electrically conductive leads. Each of the leads may then either be connected to a power source or a referenced potential and connected by vias to the leads 212 located on the opposite side of the substrate layer 210. This particular embodiment would be advantageous where it is desired to electrically connect a number of the leads 212 to either a power or a ground source.

Figure 5:
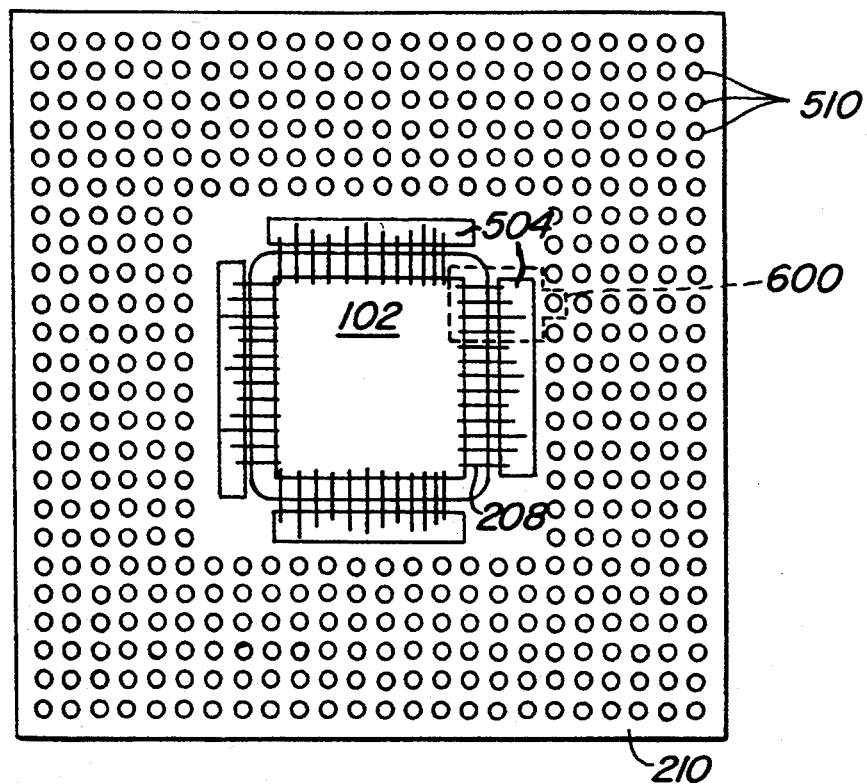
FIG. 5 is a planar view of the present invention after the die has been attached and wire bonded, but before it has been encapsulated.

FIG. 5 illustrates a planar bottom view of the package of the present invention after the die is attached to the body and electrically connected to the solder balls, but before the die is encapsulated with encapsulation material. The electrically conductive leads connecting the solder balls 114 to the bonding areas 504a-c are not shown. Note that area 600 includes a portion of the die 102, a portion of the bonding wires 208, a portion of one bonding region 504 and a solder ball 114. A closeup of this area 600 is discussed in greater detail immediately below.

Figure 6:
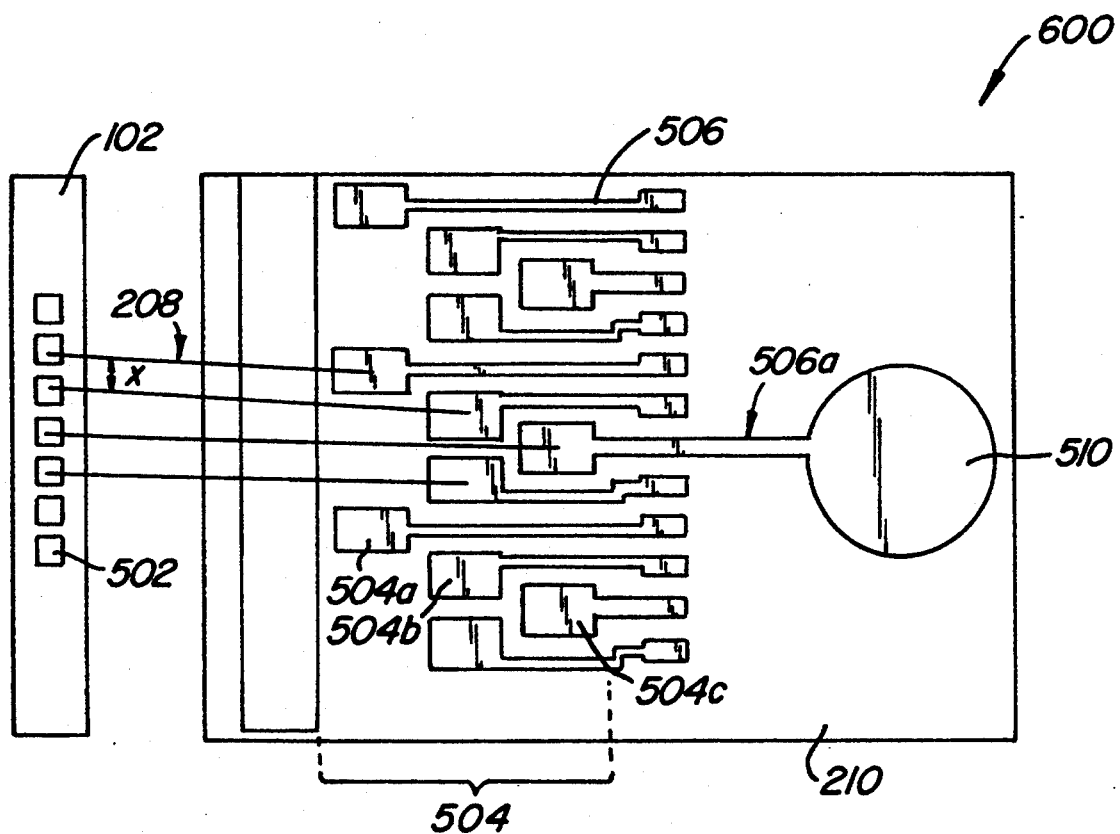
FIG. 6 is a close-up of the area 600 of FIG. 5 illustrating the staggering of the plurality of bonding areas 504*a–c*.

FIG. 6 is a closeup of the area 600 of FIG. 5. Note that the area 600 of FIG. 6 is not an exact depiction of the area 600 of FIG. 5; several of the bonding wires and leads are not shown in FIG. 6 in order to simplify the drawing for purposes of clarity. FIG. 6 is intended to illustrate the staggered positioning of each of the bonding areas 504a-c within each bonding region 504. As can be seen from FIG. 6, individual bonding areas 504a, 504b and 504c are each staggered in position relative to one another. The rationale for staggering these bonding areas is to maintain substantially equidistant spacing between each of the adjacent bonding wires 208, while at the same time maintaining the co-planar relationship of the bonding areas 504a-c in order to minimize the thickness of the package.

Manufacturing technology of the silicon die allows the bond pads 502 to be physically spaced very close together—closer than is physically possible using current technology to form bonding areas 504a-c on the substrate. For example, current die manufacturing technology allows for the bond pads 502 on the semiconductor die to be spaced about 10 microns apart from each other, as measured from their adjacent edges (i.e. 10 micron bond pad pitch). However, the pitch of the bonding areas 504a-c on the substrate 210 is limited by present substrate technology. Substrate technology is not yet available to produce bonding areas 504a-c on the substrate 210 which has a pitch of 10 microns. Rather, the minimum spacing between each lead or bonding area on the substrate is about 50 microns using current technology. Therefore, when the individual bonding areas 504a, 504b, 504c are not staggered but are aligned into a single column (or row), each of the bonding areas must be spaced at least 50 microns apart from adjacent bonding areas. Assuming the minimum die bond pad pitch is 10 microns and the minimum substrate bonding area pitch is 50 microns, the bonding wires 208 which connect the die bond pads 502 to the substrate bonding areas 504a-c will start to fan-out as the alignment mismatch (created by the aforementioned pitch restrictions) causes the individual bonding areas 504a-c to move further and further away from their corresponding bond pads 502.

This fan-out of the bonding wire from the die to the substrate board is undesirable for a number of reasons. First, as the wires 208 become longer and longer, they use up valuable space on the surface of the package which could otherwise be used for solder ball placement to thereby increase the available number of leads which the package could accommodate. In addition, as the wires become longer, the curvature of their arch or loop becomes greater which can interfere with the height restrictions of the solder balls, as discussed previously.

It is therefore desired that the pitch of the bonding wires 208 remain substantially the same (i.e. that the spacing "x" between each pair of adjacent bonding wires 208 remain substantially the same at locations close to bond pads 502 as well as close to bonding areas 504a-c). To accomplish this objective, the bonding areas 504a-c are staggered with respect to each other, as shown by individual bonding areas 504a, 504b and 504c.

Note that the wires 208 increase in length as the staggered placement of the bonding areas moves laterally. There is a trade-off between the desire to narrow the pitch of the bonding wires and the desire to keep the length of the bonding wires short. The more narrow the pitch desired the greater the number of staggered positions required, and therefore the longer the length of bonding wires used. However, as stated above, it is desirable for the bonding wires to be kept shorter rather than longer. Therefore, the number of staggered positions is limited. In FIG. 6 three staggered positions are shown as represented by bonding areas 504a, 504b and 504c respectively. It is envisioned that a greater number or a fewer number of staggered positions may be used without departing from the scope of this invention, keeping in mind that it is undesirable for the length of the bonding wires to exceed a specified maximum length which, for example, may be 60 mils.

Also shown in FIG. 6 are conductive traces 506, one of which 506a is shown being connected to a solder ball bonding pad 510. Normally, the bonding pad 510 will also include a solder ball 114 electrically connected to it, however, for purposes of clarity, the solder ball is not shown in this figure.

Figure 7:
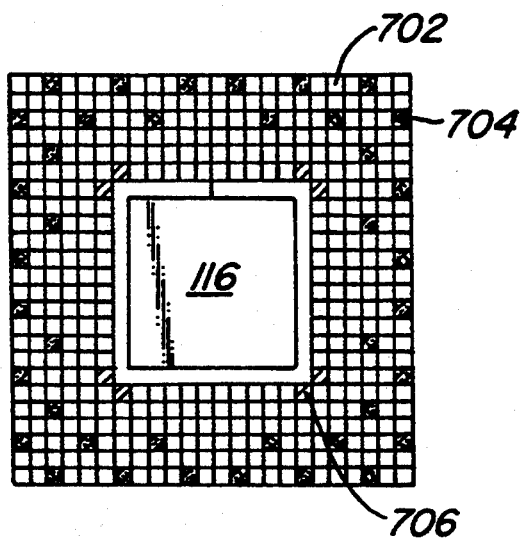
FIG. 7 is a planar view of the present invention after the die has been encapsulated, illustrating the relative number of power, ground and signal solder balls located on the package.

After the die has been bonded to the cavity ceiling and the bonding wires-attached, the die and at least a portion of the bonding wires are then encapsulated with an encapsulation material 116, such as, for example, resin, using an encapsulation or a molding process. The resultant package is illustrated in FIG. 7. FIG. 7 shows the encapsulation body 116 which encapsulates the die, at least a portion of the bonding wires, and at least a portion of the bonding region 504, including at least a portion of bonding areas 504a-c. Each of the squares surrounding the encapsulation body represents a solder ball which is to be connected to either a ground source, a power source, or a signal source. In the example of FIG. 7, white squares 702 represent solder balls which are to be connected to a signal source. Note that each solder ball can be independently connected to a separate signal source on the PC board. Lightly shaded squares 706 represent solder balls which are to be connected to a power source. The dark shaded squares 704 represent solder balls which are to be connected to a ground or reference potential. The example of FIG. 7 depicts a 24×24 ball grid array, having 432 leads, or solder balls.

Although several preferred embodiments have been described in detail herein with reference to the accompanying drawings, it is to be understood that the invention is not limited to these precise embodiments, and that various changes and modifications may be effected therein by one skilled in the art without departing from the scope or spirit of the invention as defined in the appended claims.

It is claimed:

1. A ball grid array integrated circuit chip package comprising:
   a body having a first surface and a substantially planar second surface opposite to said first surface, said body having a recessed central cavity having cavity walls and a cavity ceiling upon which a semiconductor die is mounted, said central cavity being located on a first side of said body, said first side including said first surface, wherein said cavity walls define a plurality of edges in said first surface;
   a layer of electrically non-conductive substrate having a third surface and a fourth surface opposite to said third surface, said third surface being bonded to said first surface, said layer of substrate comprising a high temperature, high strength, dielectric material;
   a pattern of electrically conductive material bonded to said fourth surface, said pattern of material forming a plurality of electrically conductive leads and regions having a plurality of first bonding areas connected to said leads, wherein each of said leads electrically connects each of said first bonding areas to a corresponding external connector bonding pad of a plurality of external connector bonding pads distributed about said first side of said body; and
   a plurality of conductive wires which electrically connect each of said first bonding areas to a corresponding bonding pad on said semiconductor die;
   said plurality of first bonding areas and external connector bonding pads being substantially co-planar, each of said regions being located adjacent to one edge of said plurality of edges, wherein first bonding areas of each of said regions are located at different distances from said one edge to form a staggered arrangement,
   wherein said staggered arrangement forms at least three rows of first bonding areas, each of said at least three rows being located at a different distance from said one edge.

2. The package of claim 1 wherein said body is non-flexible.

3. The package of claim 1 wherein said body is electrically conductive.

4. The package of claim 3 wherein said body is comprised of copper.

5. The package of claim 1 wherein said body is thermally conductive.

6. The package of claim 5 further comprising a second body for dissipating heat thermally coupled to said first body.

7. The package of claim 1 wherein said package is devoid of electrically conductive vias or through holes which are used to electrically connect said plurality of external connector bonding pads to a corresponding plurality of external connectors.

8. The package of claim 1 wherein said package includes a single bonding tier for electrically connecting said die to a plurality of external connectors, said bonding tier including said layer of substrate and said pattern of conductive material.

9. The package of claim 1 further comprising a second layer of conductive material laminated to said third surface and a layer of electrically non-conductive bonding material interposed between said second layer of conductive material and said first surface.

10. The package of claim 9 wherein said second layer of material is electrically connected to a power source.

11. The package of claim 9 wherein said second layer of material is electrically connected to a reference potential.

12. The package of claim 1 wherein said layer of substrate is comprised of a printed circuit board substrate material.

13. The package of claim 1 further comprising a body of encapsulation material which encapsulates said semiconductor die and at least a portion of said plurality of conductive wires.

14. The package of claim 1 wherein a pitch of said bonding pads of said semiconductor die is measurable along an axis, and wherein a spacing between centers of adjacent first bonding areas, as measured along said axis, is substantially equal to said pitch.

15. The package of claim 1 wherein said layer of substrate is flexible.

16. A ball grid array integrated circuit chip package comprising:
   a body having a first surface and a substantially planar second surface opposite to said first surface, said body having a recessed central cavity having cavity walls and a cavity ceiling upon which a semiconductor die is mounted, said central cavity being located on a first side of said body, said first side including said first surface, wherein said cavity walls define a plurality of edges on said first surface;
   a layer of electrically non-conductive substrate having a third surface and a fourth surface opposite to said third surface, said third surface being bonded to said first surface, said layer of substrate comprising at least one material which is different from that of said body;
   a pattern of electrically conductive material bonded to said fourth surface, said pattern of material forming a plurality of electrically conductive leads and regions having a plurality of first bonding areas connected to said leads, wherein each of said leads electrically connects each of said first bonding areas to a corresponding external connector bonding pad of a plurality of external connector bonding pads distributed about said first side of said body; and
   a plurality of conductive wires which electrically connect each of said first bonding areas to a corresponding bonding pad on said semiconductor die;
   wherein said package is devoid of electrically conductive vias or through holes which are used to electrically connect said plurality of first bonding areas to a corresponding plurality of external connectors.

17. The package of claim 16, said plurality of first bonding areas being substantially co-planar, each of said regions being located adjacent to one edge of said plurality of edges, wherein first bonding areas of each of said regions are located at different distances from said one edge to form a staggered arrangement.

18. The package of claim 17 wherein said plurality of first bonding areas and said plurality of external connector bonding pads are each substantially co-planar.

19. The package of claim 17 wherein said staggered arrangement forms at least three rows of first bonding areas, each of said at least three rows being located at a different distance from said one edge.

20. A ball grid array integrated circuit chip package comprising:
- a body having a first surface and a substantially planar second surface opposite to said first surface, said body having a recessed central cavity having cavity walls and a cavity ceiling upon which a semiconductor die is mounted, said central cavity being located on a first side of said body, said first side including said first surface, wherein said cavity walls define a plurality of edges on said first surface;
- a single bonding tier for electrically connecting said die to a plurality of external connectors, said bonding tier including:
  - a layer of electrically non-conductive substrate having a third surface and a fourth surface opposite to said third surface, said third surface being bonded to said first surface, said layer of substrate comprising at least one material which is different from that of said body; and including
  - a pattern of electrically conductive material bonded to said fourth surface, said pattern of material forming a plurality of electrically conductive leads and regions having a plurality of first bonding areas connected to said leads, wherein each of said leads electrically connects each of said first bonding areas to a corresponding external connector bonding pad of a plurality of external connector bonding pads distributed about said first side of said body; and
- a plurality of conductive wires which electrically connect each of said first bonding areas to a corresponding bonding pad on said semiconductor die.

21. The package of claim 20, said plurality of first bonding areas being substantially co-planar, each of said regions being located adjacent to one edge of said plurality of edges, wherein first bonding areas of each of said regions are located at different distances from said one edge to form a staggered arrangement.

22. The package of claim 20 wherein said plurality of first bonding areas and said plurality of external connector bonding pads are each substantially co-planar.

23. The package of claim 20 wherein said bonding tier is devoid of electrically conductive vias or through holes.

24. The package of claim 21 wherein said staggered arrangement forms at least three rows of first bonding areas, each of said at least three rows being located at a different distance from said one edge.

* * * * *